United States Patent [19]

Schweitzer, Jr.

[11] Patent Number: 4,495,489
[45] Date of Patent: Jan. 22, 1985

[54] FAULT INDICATOR WITH IMPROVED FLAG INDICATOR ASSEMBLY

[76] Inventor: Edmund O. Schweitzer, Jr., 1002 Dundee Rd., Northbrook, Ill. 60118

[21] Appl. No.: 399,996

[22] Filed: Jul. 20, 1982

[51] Int. Cl.³ .................... G01R 19/16; G08B 21/00
[52] U.S. Cl. .................................. 340/664; 340/691
[58] Field of Search ............... 324/133, 146; 340/650, 340/654, 657, 664, 691

[56] References Cited

U.S. PATENT DOCUMENTS

| | | | |
|---|---|---|---|
| 3,375,510 | 3/1968 | Pitches | 324/133 |
| 4,263,550 | 4/1981 | Schweitzer | 340/654 X |
| 4,443,795 | 4/1984 | Fowler | 324/146 |

Primary Examiner—James J. Gill
Attorney, Agent, or Firm—Lockwood, Alex, Fitzgibbon & Cummings

[57] ABSTRACT

A fault indicator for indicating the occurrence of a fault current in a power distribution system includes a rotatably mounted indicator flag. The indicator flag is actuated through successive 90° trip and reset positions by a compact magnetic pole piece assembly having four radially extending magnetic pole segments which interact with four similarly aligned magnetic poles on the indicator flag. A pair of bidirectional windings on two of the pole segments magnetizes the pole segments to rotate the flag between successive trip and reset positions. Extensions on the two pole segments along the circumference of the indicator flag provide for positive rotation of the flag in a predetermined direction.

17 Claims, 16 Drawing Figures

FAULT INDICATOR WITH IMPROVED FLAG INDICATOR ASSEMBLY

BACKGROUND OF THE INVENTION

The present invention relates generally to current sensing devices for electrical systems, and more particularly to automatically resettable alternating current fault indicators.

Various types of fault indicators have been constructed for detecting electrical faults in power distribution systems, including clamp-on type fault indicators, which clamp directly over cables in the systems, and test point type fault indicators, which are mounted over test points in cables or associated connectors of the system. Such fault indicators may be either of the manually reset type, wherein it is necessary that the indicators be physically reset, or of the self-resetting type, wherein the indicators are reset upon restoration of line current. Examples of such fault indicators are found in products manufactured by E. 0. Schweitzer Manufacturing Company of Mundelein, Ill., in U.S. Pat. Nos. 3,676,740; 3,816,816; 3,906,477; 4,034,360; 4,063,171; 4,068,529 and 4,234,847 of the present inventor, and in the copending applications of the present inventor; Fault Indicator Having a Remote Test Point at Which Fault Current is Indicated by Change in Magnetic Field, U.S. Pat. Ser. No. 103,042, filed Dec. 13, 1979, now abandoned, and Fault Indicator with Bidirectional Indicator Winding, U.S. Pat. Ser. No. 290,012, filed Dec. 13, 1979, now U.S. Pat. No. 4,438,403.

Detection of fault currents in self-resetting fault indicators may be accomplished by means of magnetic switch means, such as a magnetic reed switch positioned in close proximity to the conductor being monitored. Upon occurrence of an abnormally high fault-associated magnetic field around the conductor, the reed switch actuates a trip circuit which produces current flow in a trip winding to position an appropriate indicator member, such as a rotatably mounted indicator flag visible from the exterior of the indicator, to a trip or fault-indicating position. Upon restoration of current in the conductor, a reset circuit is actuated to produce current flow in a reset winding to reposition the indicator flag to a reset or non-fault indicating position. The invention described in the aforementioned U.S. patent application Ser. No. 290,012 provides an improvement in such fault indicators, in that it provides a simplified circuit for use in conjunction with a single bidirectional magnetic winding in place of separate trip and reset windings.

To minimize the power required by the trip and reset circuits in repositioning the indicator between reset and trip positions it is desirable that the indicator flag have minimal mass and minimal travel between positions. To these ends a rotatably mounted segmental-type indicator flag consisting of two indicating segments arranged on opposite sides of the axis of rotation of the flag has been utilized. The trip and reset circuits of the fault indicator are only required to rotate this flag 90°, in contrast to the trip and reset circuits of a conventional disc-type indicator which must rotate the indicator disc through 180°.

One drawback of previous 90° segmental-type indicator flag assemblies has been the relatively greater space requirements and complexity of such assemblies compared to 180° disc-type assemblies. This has made it difficult and unnecessarily costly to incorporate these segmental-type assemblies in the smaller indicator housings preferred in many monitoring applications. The present invention is directed to a new and improved actuator assembly which allows 90° segmental-type indicator flag systems to be provided in compact housings with space and cost requirements comparable to those of 180° disc-type systems.

Accordingly, it is a general object of the present invention to provide a new and improved fault indicator.

It is a more specific object of the invention to provide a fault indicator having a more efficient and compact indicator flag assembly for indicating the occurrence of a fault current.

It is another object of the invention to provide a fault indicator having an improved 90° segmental-type indicator flag assembly which is compact and economical to manufacture.

SUMMARY OF THE INVENTION

A fault indicator for indicating the occurrence of a fault current in an electrical conductor includes a housing, and status indicating means comprising an indicator flag rotatably mounted within the housing, the indicator flag having first and third positions corresponding to a reset state, and second and four positions corresponding to a fault-indicating state, these positions being consecutively spaced 90° about the axis of rotation of the indicator flag. A flag actuator magnet having first, second, third and fourth magnetic poles of alternating magnetic polarity spaced 90° around the axis of rotation is rotatably coupled to the indicator flag. A magnetic pole piece having first, second, third and fourth magnetic pole segments extending from a common location to predetermined locations is arranged within the housing in magnetic communication with respective ones of the first, second, third and fourth poles of the flag actuator magnet. Circuit means including a first magnetic winding on the first pole segment and a second magnetic winding on the second pole segment are provided for conditioning the first and third magnetic pole segments to a first magnetic polarity, and the second and fourth magnetic pole segments to an opposite magnetic polarity during normal current flow in the conductor, and for reversing the polarities of the pole segments upon occurrence of a fault current in the conductor whereby the indicator flag is caused to rotate from one of the first and third positions to one of the second and fourth positions upon occurrence of a fault current.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
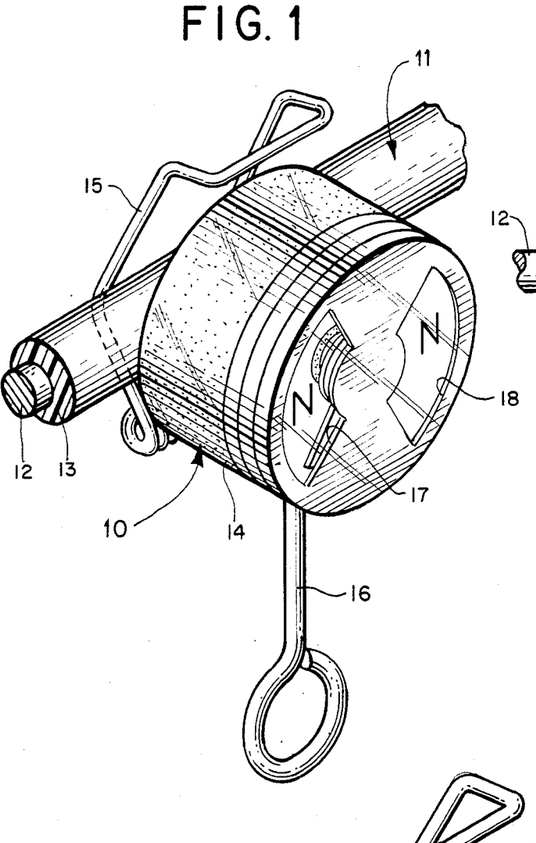
FIG. 1 is a perspective view of a fault indicator constructed in accordance with the invention mounted on an electrical distribution cable.

Referring to the Figures, and particularly to FIG. 1, a fault indicator 10 incorporating the invention is shown installed on an electrical cable 11. Cable 11, which may comprise part of an electrical distribution system, includes in accordance with conventional practice a central conductor 12 surrounded by an insulating sheath 13. The physical dimensions of the cable vary as a function of the current and voltage capacity of the cable in a manner well known to the art.

The fault indicator 10 is seen to comprise a generally cylindrical housing 14 attached at its rear end (as viewed in FIGS. 1-2) to cable 11 by means of a mounting clip 15. Clip 15, which may be formed of a spring steel wire or the like includes two parallel-spaced portions formed to engage cable 11 opposite housing 14. The clip member 15, which is anchored within housing 14 by an epoxy filler or other suitable means, includes a pair of coil portions which bias the spring clip against cable 11, thereby securely mounting the fault indicable housing to the cable.

To facilitate installation and positioning of the fault indicator a closed-loop hook member 16 is provided on the bottom (as viewed in FIG. 1) of housing 14. This hook may be engaged with a lineman's tool or the like when installing the indicator on the powered cable. A pair of viewing windows 17 and 18 on the front surface of the indicator housing enable a user to readily ascertain the status of cable 11.

Figure 2:
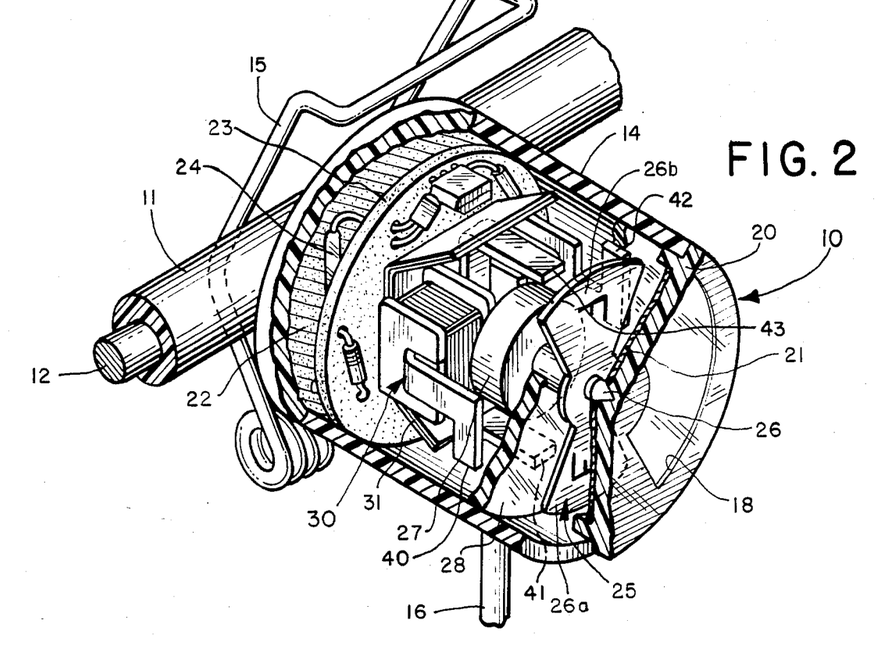
FIG. 2 is an enlarged perspective view of the fault indicator of FIG. 1 with the housing thereof partially broken away to illustrate the internal construction of the indicator.

Referring to FIG. 2, housing 14 is seen to be formed of plastic or other electrically non-conductive material. A transparent plastic end cap 20 is bonded by appropriate means to the front end of the housing. A disc-shaped mask member 21 is provided behind end cap 20 to form viewing windows 17 and 18. Appropriate indicia (not shown) may be provided on this mask member to assist in identification and operation of the fault indicator. A filler 22 of epoxy or other suitable material may be provided to seal the rear end of the housing.

Within housing 14 the principal electrical components of the fault indicator are mounted on a disc-shaped circuit board 23 mounted within the housing perpendicular to the axis of the housing and in a location intermediate the end thereof. Electrical contact is established between the electrical components mounted on circuit board 23 and clamp member 15 by an appropriate connection behind the circuit board. In addition, electrical connection is established between hook member 16 and the fault indicator circuitry by a direct connection within housing 14 to the front surface of the circuit board. To provide for sensing of a fault current in conductor 12, the fault indicator includes a magnetic switch 24 mounted to the rear surface of circuit board 23. Upon occurrence of a fault current this reed switch closes to energize circuitry which conditions the indicator to a fault indicating magnetic state.

The occurrence of a fault current in conductor 12 is indicated to a lineman or other observes by means of an indicator flag 25 rotatably mounted on a shaft 26 within housing 14. The indicator flag includes indicator segments 26a and 26b on either side of the axis of rotation. To minimize the mass of the indicator flag, these flag segments preferably each extend less than 90° around the axis of rotation. When aligned as shown in FIG. 2, the flag segments are masked by mask member 21 and are not visible to an observer. However, upon occurrence of a fault condition, the indicator flag rotates 90° such that the indicator segments are visible through windows 17 and 18. The indicator segments are preferably colored red, or another highly-visible color, to clearly indicate a fault occurrence when viewed through the windows.

Actuation of flag member 25 between the reset and fault indicating positions is accomplished by an annular flag actuator magnet 27 which is rotatably coupled to flag member 25 by shaft 26. Shaft 26 is maintained in alignment with the axis of indicator housing 14 by means of a bearing surface in a disc-shaped divider wall 28, which also provides a reset-indicating surface viewable through viewing windows 17 and 18 when the indicator flag is in its reset position. This surface is preferably colored white, or some other color contrasting with the color of the indicator flag segments, to clearly indicate a reset condition when viewed through the windows.

Figure 3:
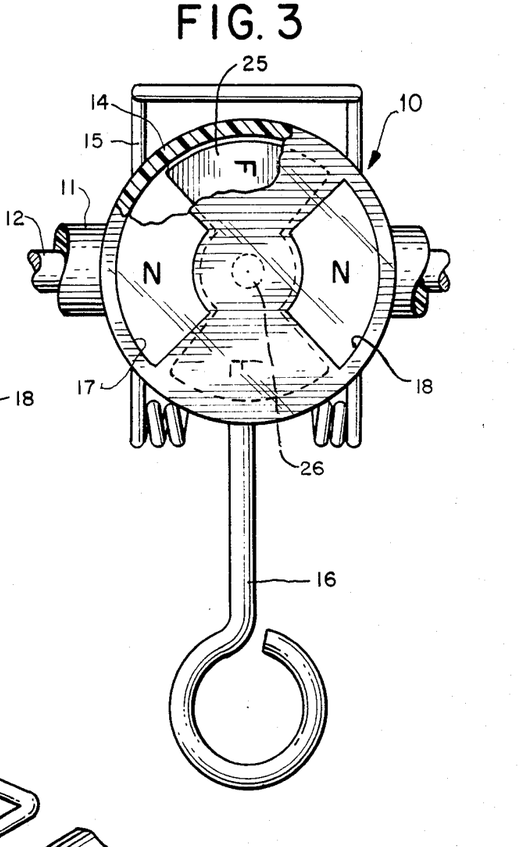
FIG. 3 is a front elevational view of the fault indicator of FIG. 1.

Actuator magnet 27, which may be formed of a magnetic material having a high coercive force, such as ceramic, is formed to provide four magnetic poles of opposite polarity, with opposite magnetic polarities at 90° intervals along the circumference of the magnet. Actuator magnet 27, and hence indicator flag 25, are biased to the position shown in FIGS. 1-3 when the fault indicator is in a non-tripped or reset condition by means of a flag actuator assembly 30, which includes four magnetic pole segments in magnetic communication with flag actuator magnet 27. The flag actuator assembly 30 is mounted to the front surface of circuit board 23 such that the four magnetic poles of the actuator assembly extend to positions adjacent the magnetic poles of actuator magnet 27. A magnetic shield 31 comprising a plurality of parallel magnetically conductive sheets is provided between the actuator assembly and the circuit board to shield the actuator assembly from the magnetic field which accompanies occurrence of a fault current in conductor 12.

Figures 4, 5:
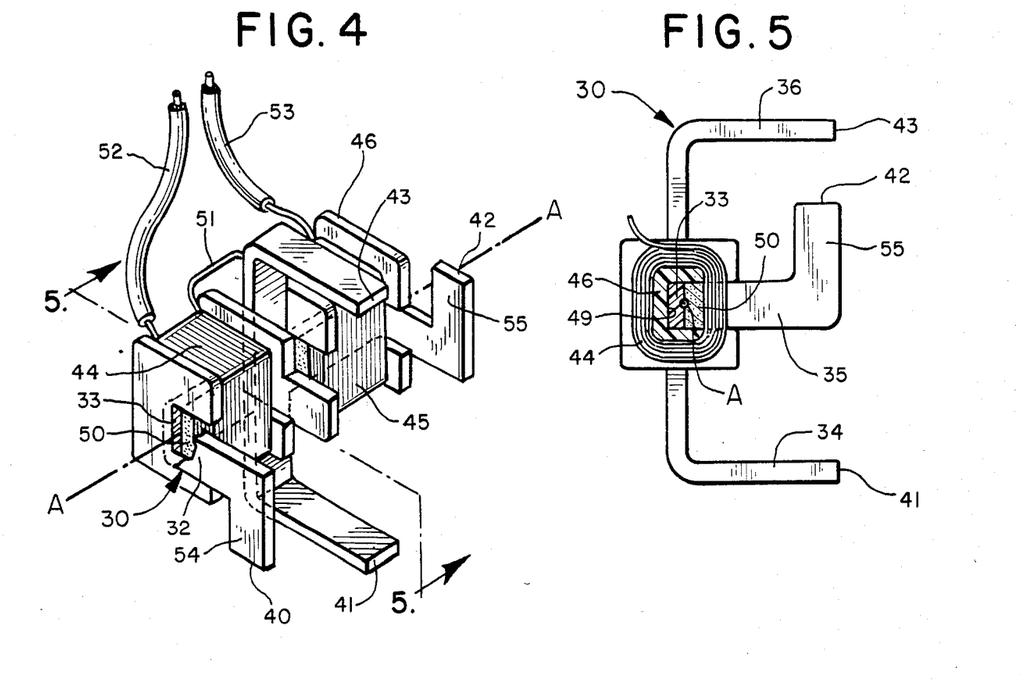
FIG. 4 is a perspective view of the flag actuator assembly of the fault indicator of FIG. 1.
FIG. 5 is a cross-sectional view of the flag actuator assembly taken along line 5—5 of FIG. 4.
Figure 6:
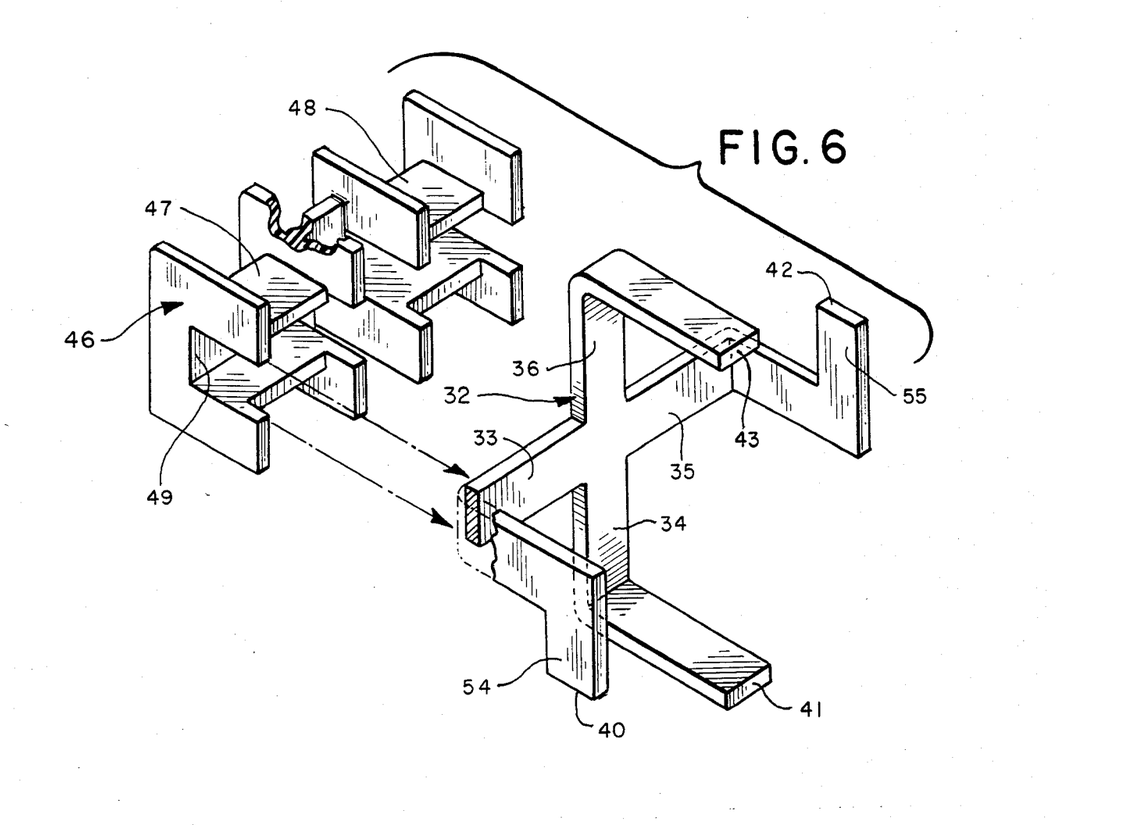
FIG. 6 is an exploded perspective view of the magnetic pole piece and bobbin incorporated in the flag actuator assembly of FIG. 4.

Referring to FIGS. 4-6, the flag actuator assembly 30 is seen to comprise, in accordance with the invention, a generally cross-shaped magnetic pole piece 32 formed of a magnetic material having a relatively low coercive force, such as chrome steel. As best shown in FIG. 6, pole piece 32 comprises four magnetic pole segments 33–36 each having an initial portion which extends in a plane generally perpendicular to the axis of indicator housing 14 and flag member 25, and a subsequent end portion which extends forward generally parallel to the axis and terminates with respective magnetic poles 40–43 in close proximity to the circumference of flag actuator magnet 27 (FIG. 2). The pole piece 32 is preferably formed as a one piece element by conventional forming techniques.

Magnetization of pole piece 32 is accomplished by a pair of magnetic windings 44 and 45 located on pole segments 33 and 35, respectively. These windings are preferably wound on a bobbin 46 which may be formed of a non-magnetic plastic material by conventional molding techniques. Bobbin 46 preferably includes a first core portion 47 for receiving winding 44, a second core portion 48 for receiving winding 45, and a channel portion 49 for receiving the initial portions of pole segments 33 and 35.

The unique construction of pole piece 32 and bobbin 46 allows the two elements to be separately manufactured and then joined during a subsequent assembly operation. Bobbin 46 may be permanently secured to the pole piece by a layer 50 (FIG. 5) of epoxy or other suitable material deposited within channel 49 after pole piece 32 has been inserted. After replacement of the epoxy layer, windings 44 and 45 may be formed by rotating the assembled pole piece and bobbin assembly along axis A—A (FIG. 4) in a conventional coil winding machine as the windings are wound on winding cores 47 and 48.

Figure 7:
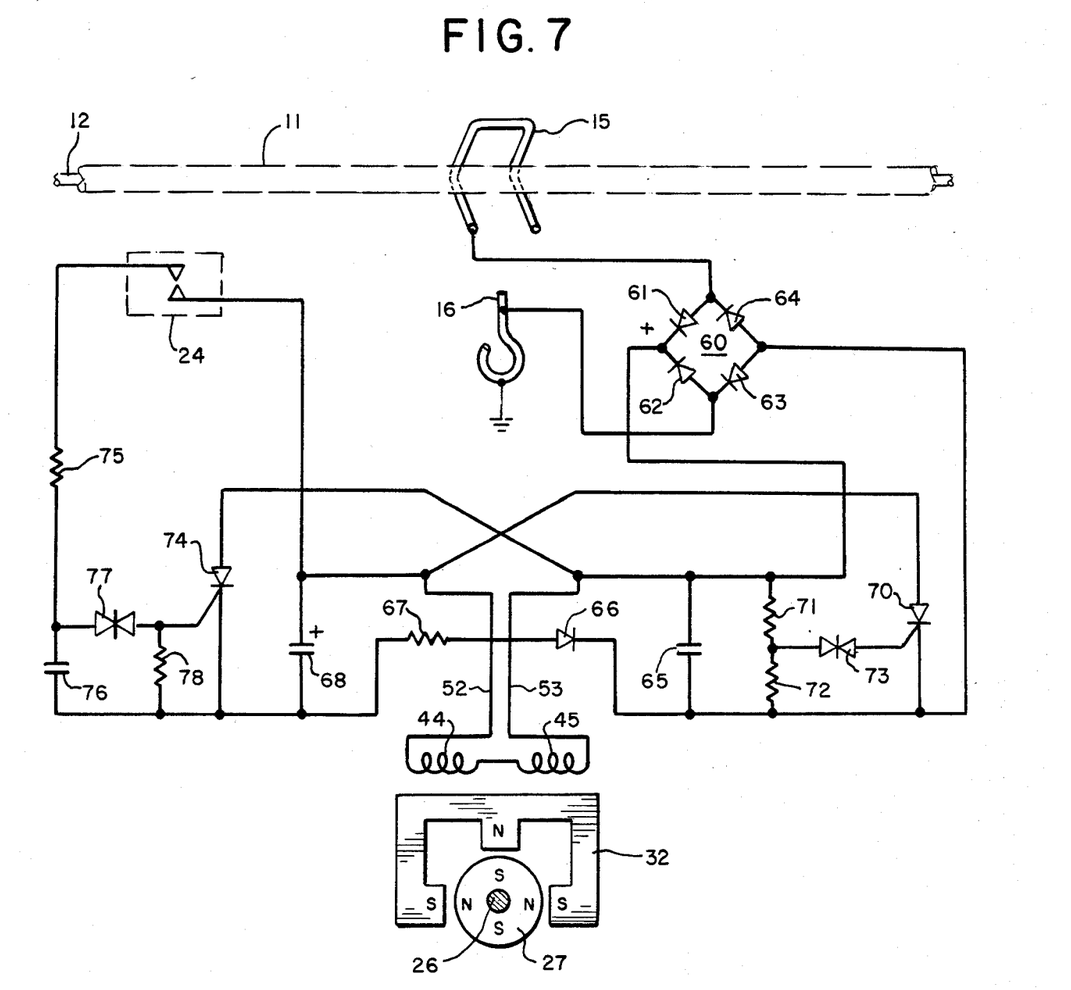
FIG. 7 is an electrical schematic diagram of the fault indicator of FIGS. 1-3.

To conserve winding space, it is preferably that windings 44 and 45 be untapped bidirectional windings to which current is supplied in one direction to establish a fault-indicating status in pole piece 32, and to which current is applied in the opposite direction to establish a reset-indicating condition. This mode of operation is described in the previously identified U.S. patent application Ser. No. 290,012. Also, windings 44 and 45, which are wound in opposite directions to provide the same magnetic polarity at magnetic poles 40 and 42, may be advantageously connected in series by a connection 51 (FIG. 4). The remaining ends of the series-connected windings may then be connected through conductors 52 and 53 to the indicator circuitry. An appropriate circuit for energizing windings 44 and 45 thus connected is shown in FIG. 7.

Alternatively, a separate trip and reset winding may be provided in place of each of windings 44 and 45, with a corresponding penalty in space and cost of manufacture. Various circuits for energizing such separate trip and reset windings are well-known to the art.

Figures 8A, 8B, 9A, 9B, 10A, 10B, 11A, 11B:
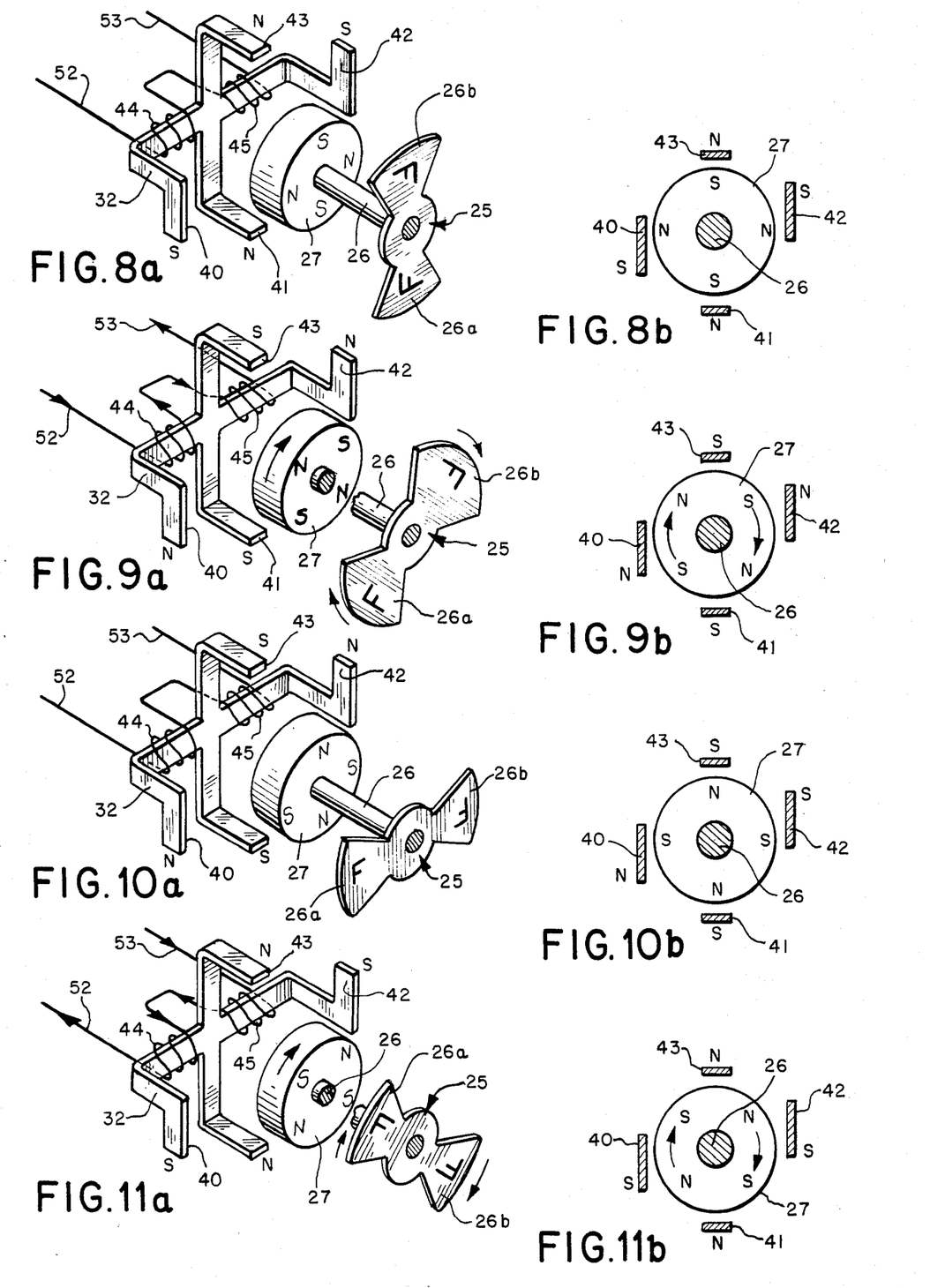
FIGS. 8a and 8b are diagrammatic views of principal components of the fault indicator in a reset state.
FIGS. 9a and 9b are diagrammatic views similar to FIGS. 8a and 8b, respectively, showing the principal components of the fault indicator in transition between a reset state and a tripped state.
FIGS. 10a and 10b are diagrammatic views similar to FIGS. 8a and 8b, respectively, showing the principal components of the fault indicator in a tripped state.
FIGS. 11a and 11b are diagrammatic views similar to FIGS. 8a and 8b, respectively, showing the principal components of the fault indicator in transition between a tripped state and a reset state.

During normal circuit operation the poles of pole piece 32 are biased to the magnetic polarities indicated in FIGS. 8a–8b. As a result, the opposite polarity poles of flag actuator magnet 27 are attracted to position the indicator flag 25 as shown, with the indicator segments 26a and 26b thereof vertically aligned and out of view of windows 17 and 18. Thus, all that is seen is the white reset-indicating surface of divider 28.

On the occurrence of a fault current in conductor 12, which may, for example, exceed 400 amperes, pole piece 32 is remagnetized to the magnetic polarities shown in FIGS. 9a–9b and 10a–10b by momentary energization of the series-connected magnetic windings 44 and 45 on pole sections 33 and 35 of the pole piece, as shown. As a result, the poles of flag actuator magnet 27 are repelled by adjacent like-polarity poles of the pole piece and the indicator flag is caused to rotate 90° to the tripped position shown in FIGS. 9a and 9b. In this position, the red indicator segments 26a and 26b of the indicator flag are visible through windows 17 and 18 and a lineman viewing the fault indicator is advised that a fault current has occurred in conductor 12.

The indicator flag remains in the fault indicating position until the poles of pole piece 32 are subsequently remagnetized to the magnetic polarities shown in FIGS. 11a–11b and 8a and 8b by momentary energization of magnetic windings 44 and 45 in the reverse direction. As a result, the flag actuator magnet, and hence the indicator flag 25, are caused to rotate from the tripped position shown in FIGS. 10a and 10b through the intermediate position shown in FIGS. 11a and 11b to the reset position shown in FIGS. 8a and 8b, and the fault indicator is conditioned to respond to a subsequent fault current.

To provide for predictable rotation of the flag actuator magnet in the clockwise direction shown, and to preclude the possibility of a balanced on-center stalled condition in which no rotation would take place, the magnetic poles associated with pole segments 33 and 35 are displaced slightly along the circumference of the flag actuator magnet. Consequently, an on-center stalled condition is not possible, since the opposing repelling force of the displaced poles exerts a turning moment on the flag actuator magnet. The actual displacement may be slight, and may be conveniently accomplished by additional pole segment portions 54 and 55 (FIG. 6) which extend along the circumference of the actuator magnet in a direction opposite to the desired direction of rotation.

Energization of the series-connected magnetic windings 44 and 45 by current in one direction upon occurrence of a fault current during either portion of the alternating current cycle in conductor 12, and energization of the windings by current in the opposite direction upon restoration of current in conductor 12, is accomplished by means of circuitry contained within the indicator housing 14. Referring to the schematic diagram shown in FIG. 7, the two untapped series-connected windings 44 and 45 of fault indicator 10 are connected by conductors 52 and 53 to the fault indicator circuitry, which may be mounted on circuit board 23 (FIG. 2). Operating power for this circuitry is obtained by means of a bridge rectifier network 60 consisting of diodes 61–64. One input terminal of this network, formed at the juncture of the anode of diode 61 and the cathode of diode 64, is connected to the wire mounting spring 15, which provides capacitive coupling to conductor 12. The other input terminal, formed at the anode of diode 62 and the cathode of diode 63, is connected to ground through the projecting hook 16, which functions as a counter-poise in a manner well known to the art to provide a reference potential lower than that of conductor 12. With this arrangement, high voltage alternating current carried in conductor 12 is capacitively coupled to bridge rectifier network 60, resulting in the production of a pulsating unidirectional current at the output terminals of the network.

The positive polarity output terminal of the bridge rectifier network, formed at the cathodes of diodes 61 and 62, is connected to the series-connected windings 44 and 45 through conductor 53, and to one terminal of a first capacitor 65. The negative polarity output terminal of the bridge rectifier network, formed at the juncture of the anodes of diodes 63 and 64, is connected to the remaining terminal of capacitor 65, and through a forward biased diode 66 and a resistor 67 to one terminal of a second capacitor 68. The other terminal of capacitor 68 is connected to the remaining terminal of the series-connected windings 44 and 45 through conductor 52. With this arrangement, capacitor 65 is charged directly, and capacitor 68 is charged through windings 44 and 45, diode 66 and resistor 67, by the pulsating unidirectional current developed by bridge rectifier network 60 during normal current flow in conductor 12.

To provide for periodic energization of windings 44 and 45 during normal current flow in conductor 12, the remaining end terminal of the windings is connected through a silicon controlled rectifier 70 to the negative polarity terminal of capacitor 65. Periodic conduction through SCR 70 is obtained by connecting the gate electrode of that device to the positive polarity output terminal of the bridge rectifier 60 through a voltage divider network comprising a pair of resistors 71 and 72 and a bilateral diode 73. SCR 70 is periodically triggered into conduction when the voltage developed across bilateral diode 73 as a result of capacitor 65 being charged by bridge rectifier 60 reaches the threshold level of the diode.

In operation, under normal current flow conditions, the voltage developed across capacitor 65 as the capacitor is charged by bridge rectifier network 60 progressively increases with time, until the threshold breakdown voltage of bilateral diode 73 is reached, at which time SCR 70 is triggered and capacitor 65 discharges through windings 44 and 45. This causes a current flow in a first direction in the windings, with the result that a reset-indicating magnetic state is established in pole piece 32.

Capacitor 68 is charged by bridge rectifier network 60 through diode 66 and windings 44 and 45. Diodes 66 prevents capacitor 68 from being discharged through SCR 70 upon conduction of that device leaving the capacitor available for energizing the windings in a reverse direction in response to a fault current condition.

In practice, the breakdown voltage of bilateral diode 73 may be in the order of 34 volts, and the time required for that portion of the voltage across capacitor 65 applied by resistor 71 and 72 to reach this threshold level with a typical voltage level of 4,400 volts on conductor 12 may be approximately four minutes. The voltage level with conductor 12 is not critical to the operation of the reset circuit, and has only the effect of changing the repetition rate of the reset cycle.

Windings 44 and 45 are energized in a second and opposite direction upon occurrence of a fault current in conductor 12 by discharge of capacitor 68 through a second SCR 74 having its cathode connected to the negative polarity terminal of the capacitor, and its anode connected to the first end terminal of the windings. Conduction is established through SCR 74 by closure of the contacts of reed switch 24, which is connected between the positive polarity terminal of capacitor 68 and the gate electrode of SCR 74 by a network comprising a resistor 75, a capacitor 76, a bilateral diode 77, and a resistor 78. Reed switch 24 is positioned within housing 14 in sufficiently close proximity to conductor 12 such that the contacts of the switch close upon occurrence of a fault current in the conductor.

Upon occurrence of a fault current, the positive polarity terminal of capacitor 68 is connected through the contacts of reed switch 24 and the circuit comprising resistors 75, 78, bilateral diode 77 and capacitor 76 to the gate electrode of SCR 74, causing that device to be rendered conductive. This causes capacitor 68 to discharge through SCR 74, energizing windings 44 and 45 in the reverse direction. The resulting magnetic flux reverses the magnetic sense of the pole piece and causes the pole piece to assume the magnetic polarities shown in FIGS. 9a–9b and 10a–10b.

To preclude the possibility of windings 44 and 45 being simultaneously actuated by currents of opposite direction by simultaneous conduction through SCR 74 and SCR 70, a predetermined time delay in conduction through SCR 74 is preferably provided following occurrence of a fault current in conductor 12. This is accomplished by resistor 75 and capacitor 76, which together form an RC time constant network in the gate circuit of SCR 74. Upon closure of the contacts of reed switch 24 it is necessary that capacitor 76 charge through resistor 75 to the threshold voltage of bilateral diode 77 before sufficient gate electrode current is supplied to SCR 74 to initiate conduction through that device. Resistor 78 serves in a conventional manner as a current drain for the gate electrode. A further detailed discussion of the operation of the circuit of FIG. 7 may be found in the previously identified copending U.S. patent application Ser. No. 290,012.

Thus, in operation windings 44 and 45 are supplied with unidirectional current in one direction from a first current storage device, capacitor 65, and in the opposite direction from a second storage device, capacitor 68. Capacitor 65 is connected to one terminal of the magnetic windings, and capacitor 68 is connected to the other terminal. A first switch device, SCR 70, periodically completes the discharge circuit for capacitor 65 to the windings during reset conditions. A second switch device, SCR 74, completes the discharge circuit for capacitor 68 to the windings upon occurrence of a fault current.

The two current storage capacitors 65 and 68 are simultaneously charged by a charging circuit which includes the line-powered bridge rectifier source 60. Capacitor 65 is charged directly and capacitor 68 is charged through the series-connected windings 44 and 45, isolation diode 66 and resistor 67. Diode 66 provides isolation for the trip circuit upon operation of the reset circuit.

While the novel indicator system of the invention has been shown in conjunction with series-connected bidirectional magnetic windings and the bidirectional actuator circuit of FIG. 7, which combination is most advantageous because of its efficiency and compactness, it will be appreciated that the invention may be utilized instead with separate reset and trip windings on each of pole segments 33 and 35. In this case, a total of four windings would be required, and actuating circuitry such as that shown and described in the previously identified U.S. Patent would be utilized.

Figure 12:
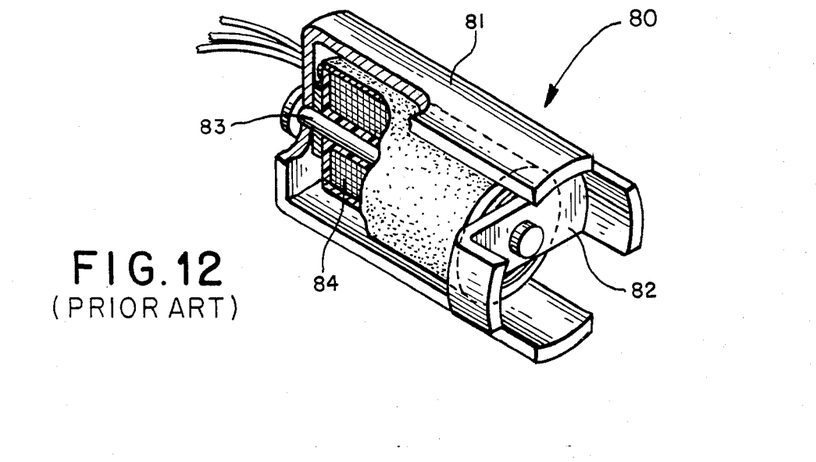
FIG. 12 is a perspective view, partially in section, of a prior art flag actuator assembly for use in fault indicators.

By reason of the compactness and simplicity of the actuator assembly 30, the fault indicator 10 may be housed in a compact housing such as housing 14. Previous actuator assemblies intended for 90° indicator flag-type indicating systems, such as the assembly 80 shown in FIG. 12, required substantially more space. This precluded housing the fault indicator in a compact housing such as housing 14. Moreover, such previous actuator assemblies utilized a pole piece which was constructed with at least three separate elements; two U-shaped elements 81, 82 and a central core element 83. These elements could not be constructed as a single one-piece element because of the necessity of installing the winding 84 on the central segment prior to installation of the U-shaped pole sections. In contrast, in applicant's invention the winding bobbin is installed on a one-piece pole piece and the windings are subsequently wound on the bobbin by merely rotating the assembly along the axis A—A shown in FIG. 4. Thus, the invention realizes a significant savings in the cost of manufacture of the actuator assembly.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A fault indicator for indicating the occurrence of a fault current in an electrical conductor, comprising, in combination:

a housing;

status indicating means comprising an indicator flag rotatably mounted within said housing, said indicator flag having first and third positions corresponding to a reset state, and second and fourth positions corresponding to a fault-indicating state, said positions being consecutively spaced 90° about the axis of rotation of the indicator flag;

a flag actuator magnet rotatably coupled to said indicator flag, said actuator magnet having first, second, third and fourth magnetic poles of alternating magnetic polarity spaced 90° around said axis of rotation;

means comprising a magnetic pole piece having first, second, third and fourth magnetic pole segments extending from a common location to predetermined locations in magnetic communication with respective ones of said first, second, third and fourth poles of said flag actuator magnet; and circuit means including a first magnetic winding on said first pole segment and a second magnetic winding on said second pole segment, for conditioning said first and third magnetic pole segments to a first magnetic polarity, and said second and fourth magnetic pole segments to an opposite magnetic polarity during normal current flow in the conductor, and for reversing the polarities of said pole segments upon occurrence of a fault current in the conductor whereby said indicator flag is caused to rotate from one of said first and third positions to one of said second and fourth positions upon occurrence of a fault current.

2. A fault indicator as defined in claim 1 wherein said magnetic pole piece comprises a single one-piece element.

3. A fault indicator as defined in claim 1 wherein at least one of said magnetic pole segments includes a portion extending from said corresponding predetermined location along the circumference of rotation of said actuator magnet so as to cause said magnet to rotate in a predetermined direction upon said magnetic pole segments changing magnetic polarity.

4. A fault indicator as defined in claim 3 wherein said first and third magnetic pole segments include said extending portions.

5. A fault indicator as defined in claim 1 wherein said magnetic pole segments are spaced 90° about said axis of rotation and initially extend in a common plane radially from said axis of rotation, and subsequently extend parallel to said axis to respective ones of said predetermined locations.

6. A fault indicator as defined in claim 5 wherein at least one of said pole segments includes a pole portion extending from said corresponding predetermined location along the circumference of rotation of said actuator magnet so as to cause said magnet to rotate in a predetermined direction upon said magnetic pole segments changing magnetic polarity.

7. A fault indicator as defined in claim 6 wherein said first and third magnetic pole segments include said extending portions.

8. A fault indicator as defined in claim 5 wherein said first and second magnetic windings are disposed on said initial portions of said first and second magnetic pole segments, respectively.

9. A fault indicator as defined in claim 1 wherein said indicator flag comprises a pair of flag segments arranged on opposite sides of said axis of rotation for viewing from the exterior of said housing.

10. A fault indicator as defined in claim 9 wherein each of said flag segments extends less than 90° about said axis of rotation.

11. A fault indicator as defined in claim 1 wherein said first and second magnetic windings are electrically connected in series and are supplied with current in one direction upon occurrence of a fault, and with current in the opposite direction upon occurrence of a reset condition.

12. A fault indicator as defined in claim 11 wherein said magnetic windings are wound in opposite directions on said magnetic pole segments.

13. A fault indicator for indicating the occurrence of a fault current in an electrical conductor, comprising, in combination:

a housing;

status indicating means comprising an indicator flag rotatably mounted within said housing, said indicator flag having first and third positions corresponding to a reset state, and second and fourth positions corresponding to a fault-indicating state, said positions being consecutively spaced 90° about the axis of rotation of the indicator flag;

a flag actuator magnet rotatably coupled to said indicator flag, said actuator magnet having first, second, third and fourth magnetic poles of alternating magnetic polarity spaced 90° around said axis of rotation;

means comprising a one-piece magnetic pole piece having first, second, third and fourth magnetic pole segments extending initially in a common plane perpendicular to said axis of rotation from a common location on said axis, and subsequently in a direction parallel to said axis to predetermined locations in magnetic communication with respective ones of said first, second, third and fourth poles of said flag actuator magnet; and circuit means including a first magnetic winding on said initial portion of said first pole segment, and a second magnetic winding on said initial portion of said second pole segment, for conditioning said first and third magnetic pole segments to a first magnetic polarity, and said second and fourth magnetic pole segments to an opposite magnetic polarity during normal current flow in the conductor, and for reversing the polarities of said pole segments upon occurrence of a fault current in the conductor whereby said indicator flag is caused to rotate from one of said first and third positions to one of said second and fourth positions upon occurrence of a fault current.

14. A fault indicator as defined in claim 13 wherein said first and second magnetic pole segments each include a portion extending from said corresponding predetermined location along the circumference of rotation of said actuator magnet so as to cause said magnet to rotate in a predetermined direction upon said magnetic pole segments changing magnetic polarity.

15. A fault indicator as defined in claim 13 wherein said indicator flag comprises a pair of flag segments arranged on opposite sides of said axis of rotation and extending less than 90° about said axis for viewing from the exterior of said housing.

16. A fault indicator as defined in claim 13 wherein said first and second magnetic windings are each bidirectional windings electrically connected in series, and are supplied with current in one direction upon occurrence of a fault, and with current in the opposite direction upon occurrence of a reset condition.

17. A fault indicator for indicating the occurrence of a fault current in an electrical conductor, comprising, in combination:

a housing;

status indicating means comprising an indicator flag rotatably mounted within said housing, said indicator flag having first and third positions corresponding to a reset state, and second and fourth positions corresponding to a fault-indicating state, said indicator flag comprising a pair of flag segments arranged on opposite sides of said axis of rotation and extending less than 90° about said axis for viewing from the exterior of said housing;

a flag actuator magnet rotatably coupled to said indicator flag, said flag actuator magnet having first, second, third and fourth magnetic poles of alternating magnetic polarity spaced 90° around said axis of rotation;

means comprising a one-piece magnetic pole piece having first, second, third and fourth magnetic pole segments extending initially in a common plane perpendicular to said axis of rotation from a common location of said axis, and subsequently in a direction parallel to said axis to locations in magnetic communication with respective ones of said first, second, third and fourth poles of said flag actuator magnet;

said first and second magnetic pole segments each including a portion extending along the circumference of rotation of said actuator magnet so as to cause said magnet to rotate in a predetermined direction upon said magnetic pole segments changing magnetic polarity;

circuit means including a first magnetic winding on said initial portion of said first pole segment, and a second magnetic winding on said initial portion of said second pole segment, said windings being bidirectional and electrically connected in series and supplied with current in one direction upon occurrence of a fault current, and with current in the opposite direction upon occurrence of a reset condition, for said conditioning first and third magnetic pole segments to a first magnetic polarity, and said second and fourth magnetic pole segments to an opposite magnetic polarity during normal current flow in the conductor, and for reversing the polarities of said pole segments upon occurrence of a fault current in the conductor whereby said indicator flag is caused to rotate from one of said first and third positions to one of said second and fourth positions upon occurrence of a fault current.

* * * * *